(12) United States Patent
Shim et al.

(10) Patent No.: US 7,235,820 B2
(45) Date of Patent: Jun. 26, 2007

(54) GROUP III-NITRIDE LIGHT EMITTING DEVICE

(75) Inventors: Hyun Wook Shim, Kyungki-do (KR); Suk Kil Yoon, Kyungki-do (KR); Jae Chul Ro, Seoul (KR); Seung Wan Chae, Kyungki-do (KR)

(73) Assignee: Samsung Electro-Mechanics Co., Ltd. (KR)

( * ) Notice: Subject to any disclaimer, the term of this patent is extended or adjusted under 35 U.S.C. 154(b) by 0 days.

(21) Appl. No.: 11/315,150

(22) Filed: Dec. 23, 2005

(65) Prior Publication Data

US 2006/0220057 A1   Oct. 5, 2006

(30) Foreign Application Priority Data

Mar. 30, 2005   (KR) .................. 10-2005-0026737

(51) Int. Cl.
*H01L 33/00* (2006.01)

(52) U.S. Cl. .................. 257/103; 257/103; 257/13; 257/E33.03

(58) Field of Classification Search ............... 257/103, 257/44, 98
See application file for complete search history.

(56) References Cited

U.S. PATENT DOCUMENTS 6,445,011 B1   9/2002   Hirano et al.
2005/0139825 A1*  6/2005   Song et al. ................. 257/44

* cited by examiner

*Primary Examiner*—Andy Huynh
*Assistant Examiner*—Thinh T Nguyen
(74) *Attorney, Agent, or Firm*—McDermott Will & Emery LLP

(57) ABSTRACT

The invention provides a group III-nitride light emitting device having improved external quantum efficiency and brightness. The light emitting device comprises an n-type clad layer, an active layer and a p-type clad layer formed in their order. Also, a p-electrode is formed on the p-type clad layer, wherein the p-electrode comprises $CuInO_2$ layer, a transparent conductive oxide layer and a reflective metal layer sequentially formed on the p-type clad layer. The reflective metal layer may be an Ag layer or an Al layer.

9 Claims, 4 Drawing Sheets

GROUP III-NITRIDE LIGHT EMITTING DEVICE

CLAIM OF PRIORITY

This application claims the benefit of Korean Patent Application No. 2005-26737 filed on Mar. 30, 2005, in the Korean Intellectual Property Office, the disclosure of which is incorporated herein by reference.

BACKGROUND OF THE INVENTION

1. Field of the Invention

The present invention relates to a light emitting device, more particularly to a group III-nitride light emitting device having enhanced brightness and electrical properties.

2. Description of the Related Art

Since development of a group III-nitride light emitting diode (LED) using $Al_xGa_yIn_{1-x-y}N$-based material, a great deal of efforts have been made to heighten brightness. A method for increasing brightness includes enhancing light emitting efficiency of a light emitting layer and extracting light generated inside into the outside without internal loss.

Several technologies have been suggested to improve external extraction efficiency (external quantum efficiency) of light generated inside a device. For example, a Ni/Au layer having a relatively good transmissibility is thinly deposited with a thickness of up to 100 Å on a p-type clad layer to be used as a p-electrode of a group III-nitride light emitting device. This allows light generated inside to exit to the outside through the Ni/Au layer (light exits in the p-electrode side). However, even despite deposition of the Ni/Au layer with a small thickness, a considerable amount of light is absorbed in the Ni/Au layer or reflected into the inside again. Also, sapphire ($Al_2O_3$) used as a substrate has low thermal conductivity so that heat generated during operation of the device is hardly released to the outside, thus deteriorating device properties.

To overcome such problems and elevate external extraction efficiency more significantly, a group III-nitride light emitting device with flip chip structure has been developed. In this case, for a metal layer used for a p-electrode, a Ni/Al layer, Ni/Ag layer or Ni/Al(Ag)/Pt layer having good reflectivity is used instead of the Ni/Au layer having good transmissibility (Al or Ag has higher reflectivity than Au). U.S. Pat. No. 6,445,011 discloses a light emitting device with flip-chip structure connected to electrodes of a submount.

FIG. 1 is a sectional view illustrating an example of a conventional flip chip light emitting device. Referring to FIG. 1, the light emitting device 10 includes an undoped GaN layer 13, an n-doped AlGaN layer 15, an active layer 17 and a p-doped AlGaN layer 19 sequentially formed on a transparent sapphire substrate 11. A p-electrode 21 made of Ni/Ag (or Al)/Pt layer (Ni is placed below Pt) having high reflectivity is formed on a p-doped AlGaN layer 19. An n-electrode 23 is formed on an area of the n-doped AlGaN layer 15. The flip chip light emitting device 10 is flipped over so that the substrate 11 faces upward, and then mounted on the submount. FIG. 2 shows a side sectional view illustrating a flip chip light emitting device 10 mounted on the submmount.

Referring to FIG. 2, the flip chip light emitting device 10 is mounted on a submount 21 so that the p-electrode 21 and n-electrode 23 of the light emitting device 10 are connected to an electrode part (not illustrated) of the submount 21 through bumps 31, 33. In this flip chip structure, light exits toward the transparent sapphire substrate 11. The p-electrode 21 uses an Ag(or Al) layer having higher reflectivity to reflect light upward (toward the output direction) through the Ag(Al) layer. This enhances external extraction efficiency of light.

In the p-electrode 21 made of the Ni/Ag(Al)/Pt layer, thick Ni layer reduces reflectivity of the p-electrode 21, while too thin Ni layer causes p-electrode 21 to be opened. The opened p-electrode 21 leads to defects of the device. Therefore, the Ni layer used should have appropriate thickness, and the Ag (Al) layer should be used as a reflective film. But use of the Ni layer having even adequate thickness results in decreased brightness.

SUMMARY OF THE INVENTION

The present invention has been made to solve the foregoing problems of the prior art and it is therefore an object of the present invention to provide a group III-nitride light emitting device capable of improving external quantum efficiency and brightness, and enhancing electrical and mechanical properties of a p-electrode.

According to an aspect of the invention for realizing the object, there is provided a group III-nitride light emitting device comprising: an n-type clad layer; an active layer formed on the n-type clad layer; a p-type clad layer formed on the active layer; and a p-electrode having a $CuInO_2$ layer, a transparent conductive oxide (TCO) layer and a reflective metal layer sequentially formed on the p-type clad layer. The reflective metal layer may comprise an Ag layer.

The $CuInO_2$ layer ensures ohmic contact between the p-type clad layer and electrode material. The TCO layer facilitates current spreading and the reflective metal layer reflects light to increase external extraction efficiency of light. According to the preferred embodiment, the group III-nitride LED comprises a flip chip LED.

According to the embodiment of the invention, the transparent conductive oxide layer is made of at least one selected from a group consisting of ZnO, AZO (Al-doped ZnO), $Zn_{1-x}Al_xO$, $Zn_{1-x}Mg_xO$, $SnO_2$, $RuO_2$, PdO, $Bi_2Ru_2O_7$, $Bi_2Ir_2O_7$, and Indium Tin Oxide(ITO). Preferably, the transparent conductive oxide layer comprises an ITO layer.

According to one embodiment of the invention, the light emitting device further comprises a sapphire substrate provided under the n-type clad layer. According to other embodiment, the light emitting device may not have a substrate such as a sapphire substrate.

According to one embodiment, the p-electrode further comprises a Pt layer or Pt/Ni layer formed on the reflective metal layer. The Pt layer or Pt/Ni layer serves to prevent migration of component atoms of the reflective metal layer.

According to one embodiment, the light emitting device may further comprise an undoped GaN layer formed underneath the n-type clad layer. In this case, the n-type clad layer may comprise an n-doped GaN layer and an n-doped AlGaN layer formed on the n-doped GaN layer.

In the specification, group III-nitride designates a binary, ternary or quaternary compound semiconductor expressed by $Al_xGa_yIn_{1-x-y}N$, where $0 \leq x \leq 1$, $0 \leq y \leq 1$, and $0 \leq x+y \leq 1$. Also, the group III-nitride light emitting device means that an n-type clad layer., an active layer and a p-type clad layer constituting the light emitting structure are made of group III-nitride.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Figure 1:
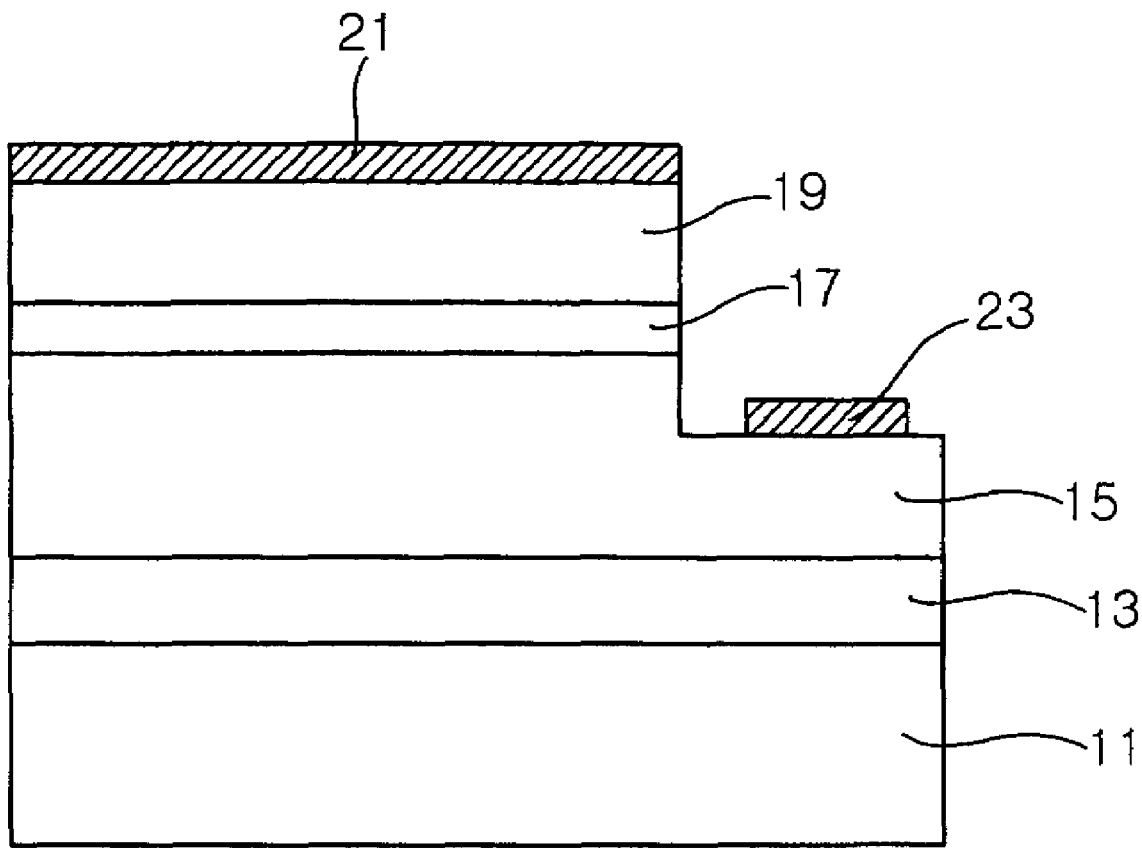
FIG. 1 is a side sectional view illustrating a conventional flip-chip group III-nitride light emitting device.
Figure 2:
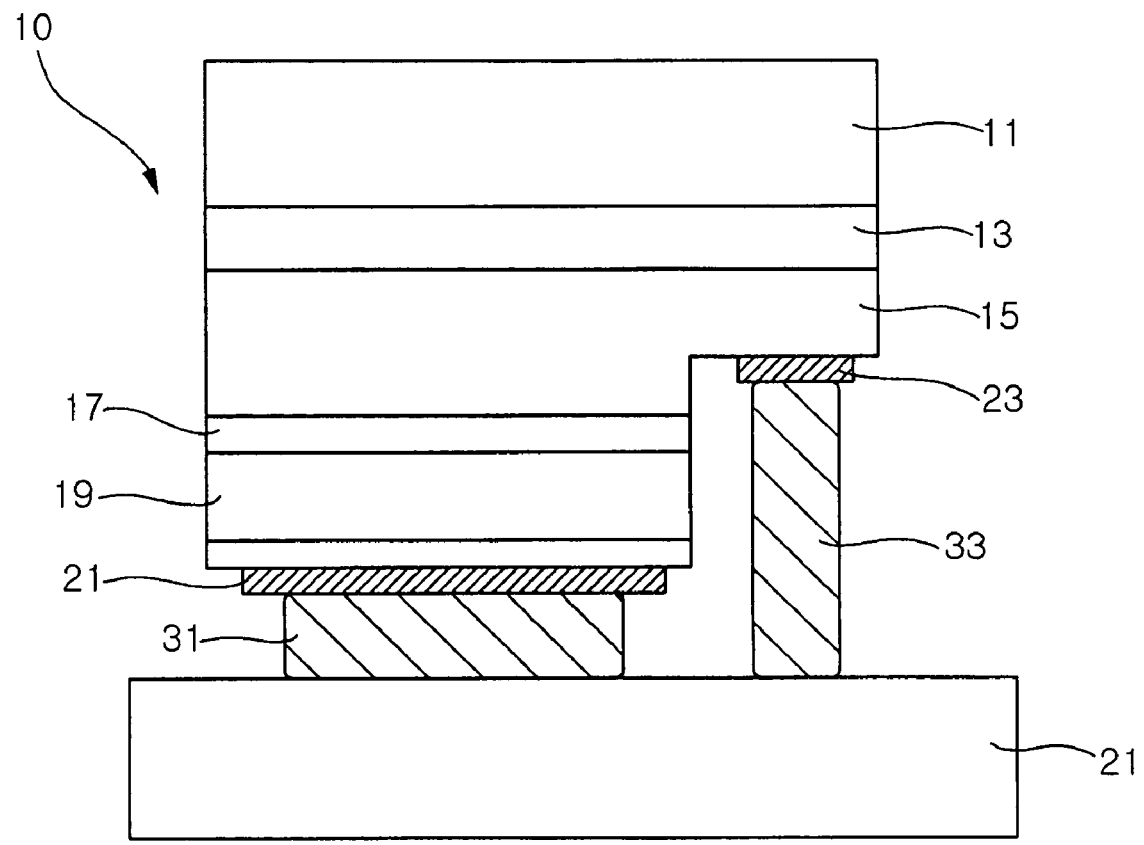
FIG. 2 is a side sectional view illustrating a conventional flip chip group III-nitride light emitting device mounted on a silicon submount.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be through and complete, and will fully convey the scope of the invention to those skilled in the art. In the drawings, the thickness of layers and regions are exaggerated for clarity.

Figure 3:
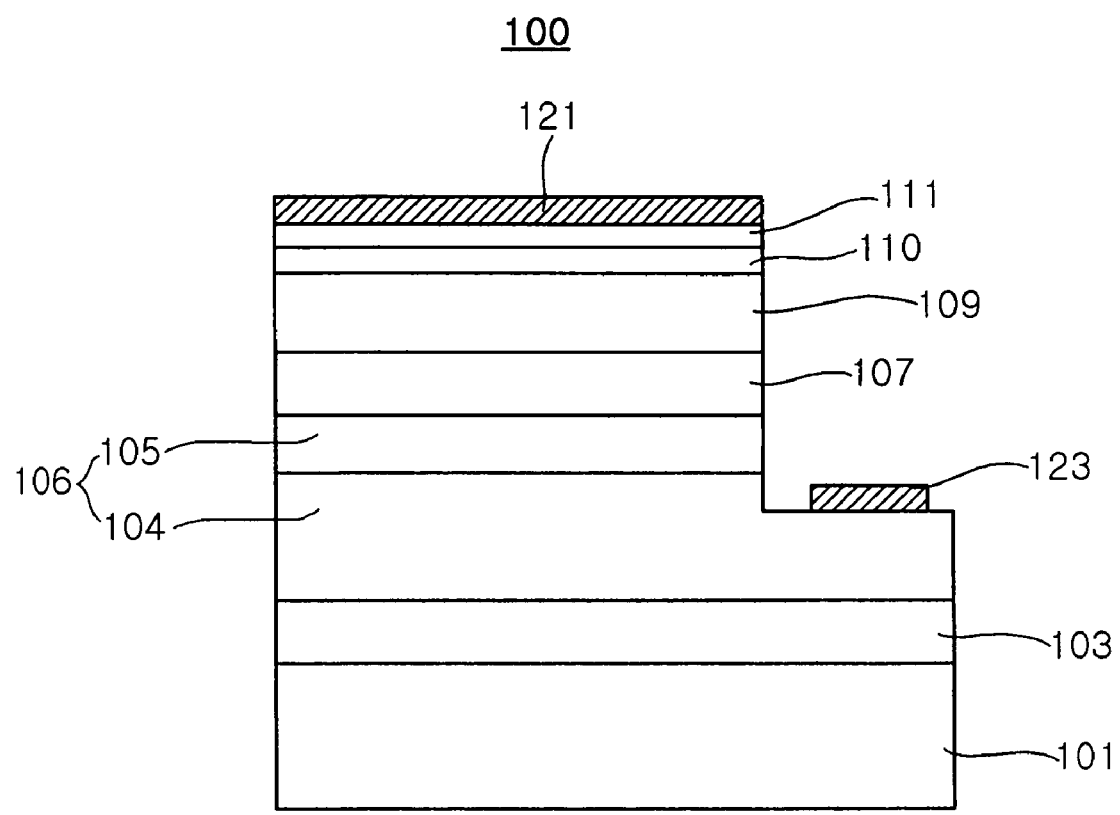
FIG. 3 is a side sectional view illustrating a group III-nitride light emitting device according to one embodiment of the invention.

FIG. 3 is a sectional view illustrating a group III-nitride light emitting device according to one embodiment of the invention. Referring to FIG. 3, the light emitting device 100 includes an undoped GaN layer 103, an n-doped GaN layer 104, an n-doped AlGaN layer 105, an active layer 107 and a p-type clad layer 109 sequentially stacked on a substrate 101. The n-doped GaN layer 104 and n-doped AlGaN layer 105 constitute an n-type clad layer 106.

As shown in FIG. 3, a $CuInO_2$ layer 110, an ITO layer 111 and an Ag layer 121 are formed in their order on a p-doped $Al_xGa_yIn_{1-x-y}N$ layer 109. The $CuInO_2$ layer 110, an ITO layer 111 and an Ag layer 121 constitute a p-electrode of the light emitting device 100. An n-electrode 123 is formed on the n-doped GaN layer 104 exposed by mesa etching.

In the p-electrode structure including the $CuInO_2$ layer 110, ITO layer 111 and Ag layer 121, the Ag layer 121 serve to increase reflectivity of the p-electrode to re-reflect light incident on the Ag layer 121 toward a sapphire substrate 151. In addition, the ITO layer 111 facilitates current spreading in the p-type clad layer 109. This prevents current channeling and thus reduces operating voltage of the light emitting device 100. Further, the $CuInO_2$ layer 110 ensures ohmic contact between the p-type clad layer 109 and electrode material. The ITO layer 111 alone cannot achieve sufficient ohimic contact.

According to the embodiment, the $CuInO_2$ layer 110 and ITO layer 111 are arranged in the ohmic contact area of the p-electrode side so that sufficient ohimic contact can be attained to lower contact resistance and obtain current spreading effect via the ITO layer 111. Also, the Ag layer 121 is arranged on the uppermost part so that light reaching the Ag layer 121 is better reflected into the sapphire substrate 101. Further, good adherence among the $CuInO_2$ layer 110, ITO layer 111, and Ag layer 121 hardly causes electrode material to be opened, unlike a conventional light emitting device.

The light emitting device 100 has a suitable structure to be used for a flip chip light emitting device. That is, the light emitting device 100 is flipped over to connect a reflective metal layer 121 and an n-electrode 123 to an electrode structure on a submount substrate so that the light emitting device can be mounted on the submount.

Figure 4:
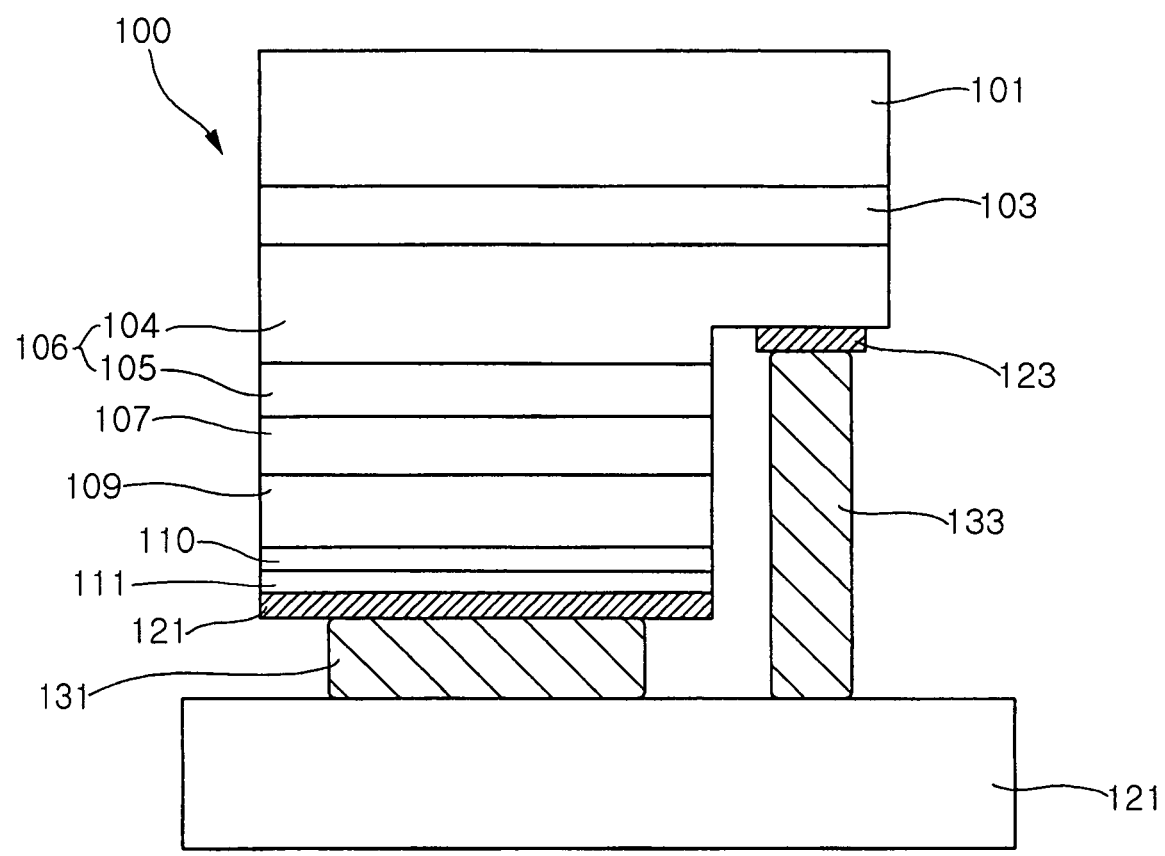
FIG. 4 is a side sectional view illustrating the group III-nitride light emitting device of FIG. 3 mounted on a silicon submount.

Referring to FIG. 4, the LED 100 described above is mounted on the submount. The emitting device 100 is mounted on a silicon submount 121 in a flipped over position. Ag layer 121 of a p-electrode and an n-electrode 123 are connected to electrode part (not shown) of the silicon submount 121 through solder bumps 131, 133. Light exits upward, through a sapphire substrate 101. An Ag layer 121 having high reflectivity is arranged in a p-type clad layer 109 so that light reaching the Ag layer 121 is better reflected into an output direction. This increases external quantum efficiency of the light emitting device 100 and thus enhances brightness thereof.

In the light emitting device 100 shown in FIG. 3, the Ag layer 121 is formed on a total surface of the ITO layer 111. But, the Ag layer 121 may be formed on only some surface area of the ITO layer 111 to implement the light emitting device (not illustrated) with a general structure other than flip chip. This also reduces contact resistance between the $CuInO_2$ layer and ITO layer and ensures current spreading effect. Furthermore, light is re-reflected into a substrate through a wire-bonded Ag layer to enhance light extraction efficiency.

In this embodiment, the ITO layer 111 is formed on the $CuInO_2$ layer 110 but typically other transparent conductive oxide (TCO) layers may be formed instead thereof. For example, instead of the ITO layer 111, a layer comprising at least one selected from a group consisting of AZO, $Zn_{1-x}Al_xO$, $Zn_{1-x}Mg_xO$, $SnO_2$, $RuO_2$, $PdO$, $Bi_2Ru_2O_7$ and $Bi_2Ir_2O_7$ may be used. Also, in case of using other TCO layer besides the ITO layer 111, similar current spreading effect can be obtained.

In addition, an Al layer may be used instead of the Ag layer 111. The Al layer also ensures light reflection effect to be commensurate with the Ag layer 111 so that the Al layer can be used as a kind of reflective metal layer. Moreover, the Ag layer 111 or Al layer may have Pt layer or Pt/Ni layer (Pt is placed below Ni layer)(not shown) formed thereon. The Pt layer or Pt/Ni layer prevents migration of component atoms of the reflective metal layer.

Further, the sapphire substrate 101 may be separated or removed from the light emitting device 100. That is, the sapphire substrate 101 is separated from the LED through a lift-off process using electron beam to achieve a thin film GaN-based LED device, thus reducing internal loss of light. This enhances brightness of the light emitting device more significantly.

As stated above, according to the invention, use of a p-electrode structure such as $CuInO_2$/TCO/Ag(Al) increases external extraction efficiency of light more considerably and enhances brightness thereof. In addition, the $CuInO_2$ layer lowers contact resistance and the TCO layer prevents current channeling. As a result, operating voltage properties of the light emitting device is boosted. Further, high adherence among the $CuInO_2$ layer, TCO layer and Ag(Al) layer reduces defects of the p-electrode part.

While the present invention has been shown and described in connection with the preferred embodiments, it will be apparent to those skilled in the art that modifications and variations can be made without departing from the spirit and scope of the invention as defined by the appended claims.

What is claimed is:

1. A group III-nitride light emitting device comprising:
an n-type clad layer;
an active layer formed on the n-type clad layer;
a p-type clad layer formed on the active layer; and
a p-electrode having a $CuInO_2$ layer, a transparent conductive oxide layer and a reflective metal layer sequentially formed on the p-type clad layer, wherein the p-electrode further comprises a Pt layer formed on the reflective metal layer.

2. A group III-nitride light emitting device comprising:
an n-type clad layer;
an active layer formed on the n-type clad layer;
a p-type clad layer formed on the active layer; and
a p-electrode having a $CuIn_2$, layer, a transparent conductive oxide layer and a reflective metal layer sequentially formed on the p-type clad layer, wherein the p-electrode further comprises a Pt/Ni layer formed on the reflective metal layer.

3. A group III-nitride light emitting device comprising:
an n-type clad layer;
an active layer formed on the n-type clad layer;
a p-type clad layer formed on the active layer;
a p-electrode having a CuInG, layer, a transparent conductive oxide layer and a reflective metal layer sequentially formed on the p-type clad layer; and
an undoped GaN layer formed underneath the n-type clad layer,
wherein the n-typed clad layer comprises an n-doped GaN layer and an n-doped AlGaN layer formed on the n-doped GaN layer.

4. The group III-nitride light emitting device according to claim 1, wherein the reflective metal layer comprises an Ag layer.

5. The group III-nitride light emitting device according to claim 1, wherein the reflective metal layer comprises an Al layer.

6. The group III-nitride light emitting device according to claim 1, wherein the transparent conductive oxide layer is made of at least of one selected from a group consisting of ZnO, AZO, $Zn_{1-x}Al_xO$, $Zn_{1-x}Mg_xO$, $SnO_2$, $RuO_2$, PdO, $Bi_2Ru_2O_7$, $Bi_2Ir_2O_7$, and ITO.

7. The group III-nitride light emitting device according to claim 6, wherein the transparent conductive oxide layer comprises an ITO layer.

8. The group III-nitride light emitting device according to claim 1, further comprising a sapphire substrate provided under the n-type clad layer.

9. The group III-nitride light emitting device according to claim 1, further comprising an undoped GaN layer formed underneath the n-type clad layer.

* * * * *